United States Patent
Oomori et al.

(10) Patent No.: US 12,154,791 B2
(45) Date of Patent: Nov. 26, 2024

(54) DRY ETCHING METHOD AND METHOD FOR PRODUCING SEMICONDUCTOR DEVICE

(71) Applicant: Central Glass Company, Limited, Ube (JP)

(72) Inventors: Hiroyuki Oomori, Ube (JP); Shunta Furutani, Ube (JP)

(73) Assignee: Central Glass Company, Limited, Ube (JP)

( * ) Notice: Subject to any disclaimer, the term of this patent is extended or adjusted under 35 U.S.C. 154(b) by 595 days.

(21) Appl. No.: 17/435,980

(22) PCT Filed: Mar. 2, 2020

(86) PCT No.: PCT/JP2020/008570
§ 371 (c)(1),
(2) Date: Sep. 2, 2021

(87) PCT Pub. No.: WO2020/195559
PCT Pub. Date: Oct. 1, 2020

(65) Prior Publication Data
US 2022/0157614 A1 May 19, 2022

(30) Foreign Application Priority Data
Mar. 22, 2019 (JP) .................. 2019-054437

(51) Int. Cl.
*H01L 21/311* (2006.01)
*C09K 13/08* (2006.01)
(Continued)

(52) U.S. Cl.
CPC ........ *H01L 21/31116* (2013.01); *C09K 13/08* (2013.01); *C09K 13/10* (2013.01);
(Continued)

(58) Field of Classification Search
None
See application file for complete search history.

(56) References Cited

U.S. PATENT DOCUMENTS 6,177,147 B1   1/2001   Samukawa et al.
2009/0123875 A1   5/2009   Soda
(Continued)

FOREIGN PATENT DOCUMENTS

JP   11-340211 A   12/1999
JP   2006-108484 A   4/2006
(Continued)

OTHER PUBLICATIONS

International Search Report (PCT/ISA/210) issued in PCT Application No. PCT/JP2020/008570 dated Apr. 14, 2020 with English translation (four (4) pages).
(Continued)

*Primary Examiner* — Roberts P Culbert
(74) *Attorney, Agent, or Firm* — Crowell & Moring LLP

(57) ABSTRACT

The present disclosure is directed to a dry etching method for a substrate having a silicon compound film, including: plasmatizing a dry etching agent; and etching the silicon compound film with the plasmatized dry etching agent through a mask formed with a predetermined opening pattern on the silicon compound film, wherein the dry etching agent contains the following first to fourth gases; the first gas is at least one compound selected from the group consisting of iodinated fluorocarbon compounds and brominated fluorocarbon compounds; the second gas is an unsaturated fluorocarbon represented by $C_nF_m$; the third gas is an unsaturated hydrofluorocarbon represented by $C_xH_yF_z$; and the fourth gas is an oxidizing gas.

14 Claims, 1 Drawing Sheet

(51) Int. Cl.
    *C09K 13/10*     (2006.01)
    *H01L 21/02*     (2006.01)

(52) U.S. Cl.
    CPC .... *H01L 21/02164* (2013.01); *H01L 21/0217* (2013.01); *H01L 21/31144* (2013.01)

(56) References Cited

U.S. PATENT DOCUMENTS

| | | |
|---|---|---|
| 2010/0216314 A1 | 8/2010 | Honda |
| 2017/0162399 A1 | 6/2017 | Takayama et al. |
| 2018/0204728 A1 | 7/2018 | Oomori et al. |
| 2018/0286707 A1* | 10/2018 | Hudson ............... H01J 37/3244 |
| 2019/0228983 A1 | 7/2019 | Sakurai et al. |
| 2019/0345385 A1 | 11/2019 | Oomori et al. |

FOREIGN PATENT DOCUMENTS

| | | |
|---|---|---|
| JP | 2009-123866 A | 6/2009 |
| JP | 2010-192825 A | 9/2010 |
| JP | 2017-50529 A | 3/2017 |
| JP | 2017-103388 A | 6/2017 |
| JP | 2018-141146 A | 9/2018 |
| WO | WO 2007/026197 A1 | 2/2017 |
| WO | WO 2018/037799 A1 | 3/2018 |

OTHER PUBLICATIONS

Japanese-language Written Opinion (PCT/ISA/237) issued in PCT Application No. PCT/JP2020/008570 dated Apr. 14, 2020 (five (5) pages).

* cited by examiner

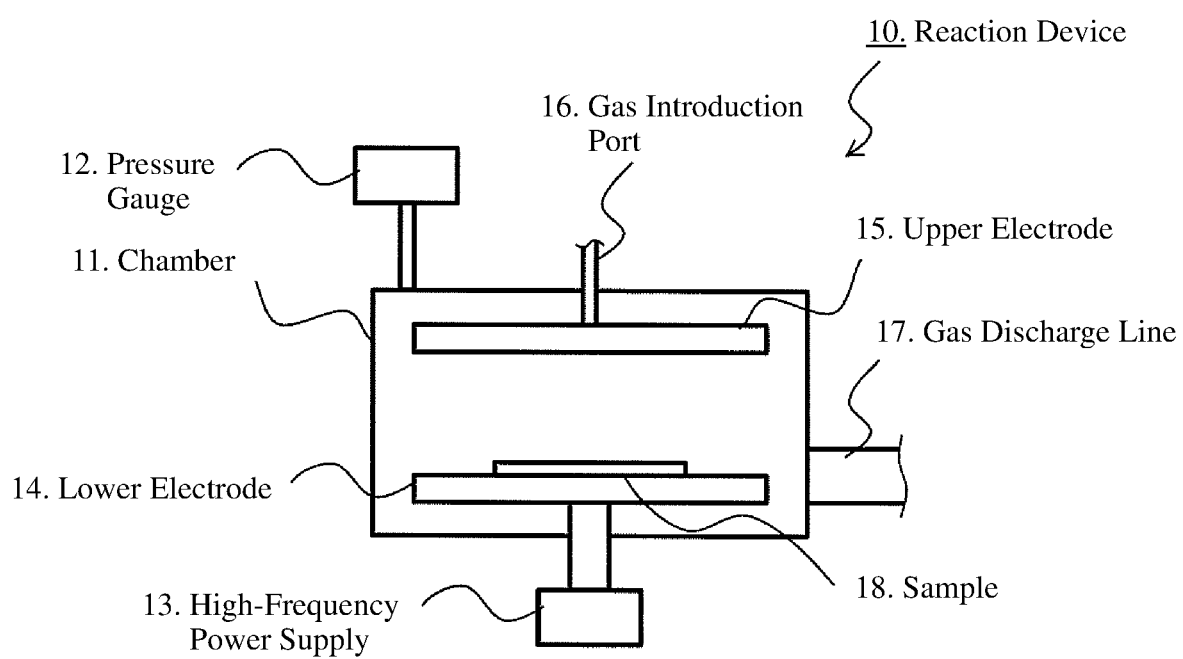

DRY ETCHING METHOD AND METHOD FOR PRODUCING SEMICONDUCTOR DEVICE

TECHNICAL FIELD

The present disclosure relates to a dry etching method using a dry etching agent containing an iodinated fluorocarbon compound or a brominated fluorocarbon compound.

With the recent advance of fine processing in the manufacturing of semiconductor devices, there have been sought etching technologies using new techniques or materials capable of decreasing line widths.

In general, the manufacturing of a semiconductor device includes an etching step for forming a pattern of holes or trenches etc. in a silicon compound such as silicon nitride or silicon oxide. The etching step is performed by, after providing a mask layer of photoresist or amorphous carbon etc. with a predetermined pattern onto the etching target material of silicon compound, subjecting the etching target material to plasma etching through the mask layer. By this etching step, the silicon compound can be anisotropically etched so that it is possible to form a desired pattern in the silicon compound.

It is conceivable that the occurrence of collapse of the pattern due to insufficient etching selectivity between the mask material such as photoresist or amorphous carbon and the silicon compound such as silicon nitride or silicon oxide as the etching target material would become an issue in decreasing line widths.

In order to avoid such a defective issue, unsaturated fluorocarbons such as $c\text{-}C_4H_8$ and $C_4F_6$ are coming into use as etching gases in place of saturated fluorocarbons such as $CF_4$. These unsaturated fluorocarbon gases generate a large amount of $CF_2$ radicals or CF radicals in a plasma. The generated radical species have the function of forming a polymerization film on lateral walls of the etched trenches or etching holes and on the mask layer to thereby prevent excessive etching caused by fluorine radicals etc.

In the case of using the unsaturated fluorocarbon, however, it is difficult to control the ratio of $CF_3$ ions as main etching species to $CF_2$ radicals or CF radicals and thus difficult to achieve both of sufficient etching rate and sufficient selectivity ratio.

As a solution to the above-mentioned problem, Patent Document 1 discloses a processing method for a substrate having a $SiO_2$ film deposited on a silicon wafer, with a resist being applied onto the $SiO_2$ film, wherein the processing method uses a gas containing in its molecule at least a first halogen element and a second halogen element higher in atomic number than the first halogen element and includes the steps of allowing excitation means to supply the gas molecule with an energy greater than the bond dissociation energy of the second halogen element in the gas molecule and smaller than the bond dissociation energy of the first halogen element in the gas molecule, thereby selectively eliminating the second halogen element from the gas molecule to generate active species, and irradiating the substrate with the active species. Examples of the gas containing in its molecule at least the first halogen element and the second element higher in atomic number than the first halogen element include: iodinated fluorocarbon compounds such as $CF_3I$ and $C_2F_5I$; and brominated fluorocarbon compounds such as $CF_2Br_2$.

Patent Document 2 discloses a first etching process in which a silicon-containing layer on a substrate is etched by the use of $CF_3I$ through a mask of resist with a predetermined pattern. Patent Document 3 discloses a dry etching method in which a $SiO_2$ interlayer insulating film disposed on a substrate and covered with a resist mask is etched by the use of a iodinated fluorocarbon compound gas such as $CF_3I$ or a brominated fluorocarbon compound gas such as $CF_3Br$.

Furthermore, Patent Document 4 discloses a dry etching method in which a laminated film of layers of silicon oxide and silicon nitride is etched by the use of a dry etching agent containing $C_3H_2F_4$, an unsaturated perfluorocarbon and an oxidizing gas.

PRIOR ART DOCUMENTS

Patent Documents

Patent Document 1: Japanese Laid-Open Patent Publication No. $H_{11}$-340211
Patent Document 2: Japanese Laid-Open Patent Publication No. 2009-123866
Patent Document 3: Japanese Laid-Open Patent Publication No. 2006-108484
Patent Document 4: International Publication No. 2007/026197

SUMMARY OF THE INVENTION

As mentioned above, Patent Documents 1 to 3 each disclose an etching method using an iodinated fluorocarbon compound such as $CF_3I$ or a brominated fluorocarbon compound such as $CF_2Br_2$ as an etching gas. The disclosed etching method is useful to obtain a desired etching shape. It has however become apparent that there is a problem that, when an etching step is performed by this method, iodine atoms or bromine atoms generated by plasma decomposition stay in the system and then remain on the substrate after the etching step by being adhered to the substrate whereby the characteristics of the device are influenced by the remaining iodine atoms or bromine atoms. It is preferable that the amount of the remaining irodine atoms or bromine atoms on the substrate is $1 \times 10^{11}$ atoms or less per 1 $cm^2$. In the fields of advanced materials, there may be a case where the amount of the remaining irodine atoms or bromine atoms on the substrate needs to be reduced to $5 \times 10^{10}$ atoms or less depending on the process.

Under these circumstances, there has been a demand to develop an etching gas and etching method by which there are less iodine atoms or bromine atoms remaining on the substrate even with the use of an iodinated fluorocarbon compound or a brominated fluorocarbon compound as the etching gas.

Further, Patent Document 4 does not recite iodinated fluorocarbon compounds and brominated fluorocarbon compounds as examples of the additive gas and makes no mention about iodine atoms or bromine atoms remaining on the substrate.

The present disclosure has been developed in view of the above-mentioned problems. It is an object of the present disclosure to provide an etching method capable of etching a silicon compound film on a substrate with the use of an iodinated fluorocarbon compound or a brominated fluorocarbon compound while allowing less iodine atoms or bromine atoms to remain on the substrate.

The present inventors have found as a result of various studies made to achieve the above object that, when an unsaturated fluorocarbon having an unsaturated bond and an unsaturated hydrofluorocarbon having an unsaturated bond are used in combination with an iodinated fluorocarbon compound or a brominated fluorocarbon compound, it is possible to suppress the amount of iodine atoms or bromine atoms remaining on a substrate while controlling the ratio of ion species generated. The present disclosure is based on this finding.

Accordingly, the present disclosure provides a dry etching method for a substrate having a silicon compound film, comprising: plasmatizing a dry etching agent; and etching the silicon compound film with the plasmatized dry etching agent through a mask formed with a predetermined opening pattern on the silicon substrate film, wherein the dry etching agent comprises at least an iodinated fluorocarbon compound or a brominated fluorocarbon compound and further comprises an unsaturated fluorocarbon represented by $C_nF_m$ (where n is an integer of 2 to 5; and m is an integer of 2, 4, 6 or 8, excluding the combination of n:m=2:6, 2:8, 3:2, 3:8 and 5:2), an unsaturated hydrofluorocarbon represented by $C_xH_yF_z$ (where x is an integer of 2 to 4; and y and z are integers satisfying y+z=2, 4, 6 or 8, excluding the combination of x: y+z=2:6, 2:8, 3:2 and 3:8) and an oxidizing gas.

BRIEF DESCRIPTION OF THE DRAWINGS

FIG. 1 is a schematic view of a reaction device used in Examples and Comparative Examples.

DETAILED DESCRIPTION OF THE EMBODIMENTS

Hereinafter, embodiments of the present disclosure will be described in detail below. It is to be understood that: the scope of the present disclosure is not limited to the following embodiments; and various changes and modifications of the following embodiments can be made as appropriate within the range that does not impair the effects of the present disclosure.

[Dry Etching Method]

The present embodiment is directed to a dry etching method for etching a silicon compound film such as $SiO_2$ or $Si_3N_4$ by plasma etching with the use of a dry etching agent containing all of first to fourth gases. The first gas is a gas of one or more compounds selected from the group consisting of iodinated fluorocarbon compounds and brominated fluorocarbon compounds. The second gas is a gas of unsaturated fluorocarbon represented by $C_nF_m$ (where n is an integer of 2 to 5; and m is an integer of 2, 4, 6 or 8, excluding the combination of n:m=2:6, 2:8, 3:2, 3:8 and 5:2). The third gas is a gas of unsaturated hydrofluorocarbon represented by $C_xH_yF_z$ (where x is an integer of 2 to 4; and y and z are integers satisfying y+z=2, 4, 6 or 8, excluding the combination of x: y+z=2:6, 2:8, 3:2 and 3:8). The fourth gas is an oxidizing gas.

Examples of the iodinated fluorocarbon compounds include $CF_3I$, $CF_2I_2$, $CFI_3$, $C_2F_5I$, $C_2F_4I_2$, $C_2F_3I_3$, $C_2F_2I_4$, $C_2FI_5$ and $C_3F_7I$. Examples of the brominated fluorocarbon compounds include $CF_3Br$, $CF_2Br$, $CFBr_3$, $C_2F_5Br$, $C_2F_4Br_2$, $C_2F_3Br_3$, $C_2F_2Br_4$, $C_2FBr_5$ and $C_3F_7Br$. These iodinated fluorocarbon compounds and brominated fluorocarbon compounds can be used solely or in combination of two or more thereof.

Examples of the unsaturated fluorocarbon represented by $C_nF_m$ include $C_2F_2$, $C_2F_4$, $C_3F_4$, $C_3F_6$, $C_4F_2$, $C_4F_4$, $C_4F_6$, $C_4F_8$, $C_5F_4$, $C_5F_6$ and $C_5F_8$. Among others, $C_3F_6$, $C_4F_6$ and $C_5F_8$ are preferred in terms of ease of production.

Examples of the unsaturated hydrofluorocarbon represented by $C_xH_yF_z$ include $C_2HF$, $C_2H_3F$, $C_2H_2F_2$, $C_2HF_3$, $C_3HF_3$, $C_3H_2F_2$, $C_3H_3F$, $C_3H_5F$, $C_3H_4F_2$, $C_3H_3F_3$, $C_3H_2F_4$, $C_3HF_5$, $C_4HF$, $C_4HF_3$, $C_4H_2F_2$, $C_4H_3F$, $C_4HF_5$, $C_4H_2F_4$, $C_4H_3F_3$, $C_4H_4F_2$, $C_4H_5F$, $C_4HF_7$, $C_4H_2F_6$, $C_4H_3F_5$, $C_4H_4F_4$, $C_4H_5F_3$, $C_4H_6F_2$ and $C_4H_7F$. Among others, $C_3H_3F_3$, $C_3H_2F_4$ and $C_3HF_5$ are preferred in terms of ease of production. In terms of etching selectivity, more preferred is $C_3H_2F_4$.

The silicon compound film is one or more films selected from the group consisting of silicon oxide films and silicon nitride films. The silicon oxide films and silicon nitride films can be used solely or in combination thereof. The silicon oxide is represented by the chemical formula: $SiO_x$ (where x is greater than or equal to 1 and smaller than or equal to 2). A typical example of the silicon oxide is $SiO_2$. The silicon nitride is represented by the chemical formula: $SiN_x$ (where x is greater than or equal to 0.3 and smaller than or equal to 9). A typical example of the silicon nitride is $Si_3N_4$.

There is no particular limitation on the substrate to which the dry etching method according to the present invention is applied as long as the substrate has the silicon compound film. In order to show a remarkable effect of reducing the amount of iodine or bromine atoms remaining on the substrate, it is preferable that the substrate has a member composed of silicon. The silicon can be either monocrystalline, polycrystalline or amorphous. In other words, the substrate is preferably in either or both of the following: where the substrate body itself is a silicon wafer; and where the substrate has formed thereon a silicon film in addition to the silicon compound film. More specifically, the dry etching method according to the present embodiment is applicable to a silicon wafer having formed thereon a silicon compound film, a silicon wafer having formed thereon both of a silicon compound film and a silicon film, or a substrate different in kind from a silicon wafer and having formed thereon both of a silicon compound film and a silicon film.

The mechanism of reducing the amount of iodine or bromine atoms remaining on the substrate in the present embodiment is not clear, but is assumed as follows.

It is known from Patent Document 1 that, in the case of using an iodinated fluorocarbon compound or brominated fluorocarbon compound as an etching gas, a bond between iodine or bromine and carbon in the compound is easily cleaved in a plasma so that either radicals or ions of iodine or bromine, or both of them, are dissociated.

These radicals or ions, or both of them, are transferred onto the substrate by electrical attraction or diffusion, and then, bonded to dangling bonds of silicon atoms on the substrate surface. As a consequence, there remains iodine or bromine atoms on the substrate even after the etching step.

It is common to, after the etching step, perform a step of removing a polymerization film deposited on the substrate by ashing or thermal annealing, followed by performing a cleaning step with a cleaning solution. With the recent trend of fine semiconductor processing, however, the problem of so-called pattern collapse caused during the cleaning step is becoming serious. The cleaning step may thus not be performed in some processing lines to avoid this pattern collapse problem. In such a case, it is expected that the remaining iodine or bromine atoms on the substrate surface, which have heretofore been removed by the cleaning step, would become more pronounced.

In the present embodiment, the unsaturated fluorocarbon and the unsaturated hydrofluorocarbon are used. Hydrogen atoms contained in the molecules of the unsaturated hydrofluorocarbon are dissociated. Even in the plasma, the dissociated hydrogen atoms are easily diffused because of their low atomic weight. The dissociated hydrogen atoms are then preferentially coupled to the dangling bonds of the silicon atoms. It is accordingly expected that, by quick coupling of the hydrogen atoms to the dangling bonds of the silicon atoms, the radicals of iodine or bromine will be prevented from being coupled to the dangling bonds of the silicon atoms. It is further expected that, when the hydrogen atoms are bonded to the iodine or bromine atoms, the iodine or bromine atoms would be discharged in the form of HI or HB from the system. By these actions, the hydrogen contained in the unsaturated hydrofluorocarbon is assumed to prevent the iodine or bromine in the etching gas from being coupled to and remaining on the substrate surface.

The unsaturated fluorocarbon and the unsaturated hydrofluorocarbon have the feature of higher polymerizability than a saturated fluorocarbon with no unsaturated bond and a saturated hydrofluorocarbon with no unsaturated bond. In particular, the hydrogen-free unsaturated fluorocarbon is higher in polymerizability. During the plasma etching step, the polymerization film of fluorocarbon is also formed on the substrate. This polymerization film serves as a protecting film during the etching step to suppress excessive etching. After the etching step, the polymerization film is no longer needed and thus is removed by the ashing or thermal annealing step. It is assumed that the iodine or bromine atoms that have not been discharged out of the system would be incorporated in the polymerization film during the etching step and removed along with the polymerization film by the subsequent ashing or thermal annealing step.

In short, it is assumed that the occurrence of the remaining iodine or bromine atoms on the substrate is suppressed by both of the effect of preventing coupling of the iodine or bromine atoms to the substrate surface by the action of the hydrogen atoms and the effect of removing the iodine or bromine atoms incorporated in the polymerization film along with the removal of the polymerization film.

It is preferable that, after the execution of the dry etching method according to the present embodiment, the amount of the remaining iodine or bromine atoms on the surface of the substrate with which the dry etching agent has come into contact is $1 \times 10^{11}$ atoms/cm$^2$ or less.

It is also preferable that the number of iodine and bromine atoms contained in the first gas is less than or equal to 2 times, more preferably less than or equal to 1 time, the number of hydrogen atoms contained in the third gas. This is because, when the number of iodine or bromine atoms contained in the dry etching agent is more than 2 times the number of hydrogen atoms contained in the dry etching agent, the amount of the remaining iodine or bromine atoms on the substrate becomes large.

In other words, it is preferable to satisfy the relationship of $N_A \times V_A \leq 2 \times N_B \times V_B$ where $N_A$ represents the number of iodine or bromine atoms contained in one molecule of the iodinated fluorocarbon compound or brominated fluorocarbon compound of the first gas; $N_B$ represents the number of hydrogen atoms contained in the unsaturated hydrofluorocarbon; and $V_A$ and $V_B$ represent the volume fractions of the iodinated fluorocarbon compound or brominated fluorocarbon compound and the unsaturated hydrofluorocarbon, respectively. It is more preferable to satisfy the relationship of $N_A \times V_A \leq N_B \times V_B$.

As to the mixing ratio of the iodinated fluorocarbon compound or brominated fluorocarbon compound, the unsaturated fluorocarbon and the unsaturated hydrofluorocarbon, the volume of the iodinated fluorocarbon compound or brominated fluorocarbon compound (first gas) is preferably in the range of 0.01 to 2 times the sum of the volumes of the unsaturated fluorocarbon (second gas) and the unsaturated hydrofluorocarbon (third gas). In order to enhance the effect of the iodinated fluorocarbon compound or brominated fluorocarbon compound, the volume of the iodinated fluorocarbon compound or brominated fluorocarbon compound is more preferably in the range of 0.1 to 1 time the sum of the volumes of the unsaturated fluorocarbon and the unsaturated hydrofluorocarbon.

As to the mixing ratio of the unsaturated fluorocarbon and the unsaturated hydrofluorocarbon, the effect of suppressing the remaining iodine or bromine atoms on the substrate by the action of the hydrogen atoms is decreased when the mixing rate of the unsaturated hydrofluorocarbon is too low; and the amount of formation of the polymerization film is decreased when the mixing rate of the unsaturated fluorocarbon is too low. Thus, the mixing ratio of the unsaturated fluorocarbon and the unsaturated hydrofluorocarbon is set such that the volume ratio of the unsaturated fluorocarbon and the unsaturated hydrofluorocarbon is preferably in the range of unsaturated fluorocarbon (second gas):unsaturated hydrofluorocarbon (third gas)=1:0.05 to 20, more preferably 1:0.1 to 10. Since the mixing ratio of these unsaturated fluorocarbon and hydrofluorocarbon gases has an influence on the etching shape, the mixing ratio of the unsaturated fluorocarbon and hydrofluorocarbon gases can be adjusted as appropriate within the above-mentioned range according to the kind and structure of the etching target film.

In the dry etching agent, the oxidizing gas is contained as the fourth gas. Examples of the oxidizing gas include $O_2$, $O_3$, CO, $CO_2$, $COCl_2$, $COF_2$, $NO_2$ and the like. Among others, $O_2$ is preferred in terms of availability and ease of handling. The amount of the oxidizing gas contained is preferably in the range of 1 vol % to 50 vol %, more preferably 2 vol % to 30 vol %, still more preferably 5 vol % to 20 vol %, based on the total amount of the dry etching agent.

For reduction of cost and improvement of handing safety, it is preferable to contain an inert gas as a fifth gas in the dry etching agent. Examples of the inert gas include: noble gases such as argon gas, helium gas, neon gas, krypton gas and xenon gas; and nitrogen gas. Among others, argon gas, helium gas, neon gas and krypton gas are preferred in terms of availability and less interaction. The amount of the inert gas contained is preferably 0 vol % to 98 vol %, more preferably 5 vol % to 80 vol %, still more preferably 30 vol % to 70 vol %, based on the total amount of the dry etching agent.

When performing the plasma etching step, it is preferable to apply a negative direct-current self-bias voltage. In order to carry out etching with high straightness in the direction perpendicular to the film, it is more preferable to apply a negative direct-current self-bias voltage whose absolute value is greater than or equal to 500 V, still more preferably greater than or equal to 750 V. The greater the absolute value of the negative direct-current self-bias voltage, the less the amount of side etching. However, it is not so preferable that the absolute value of the negative direct-current self-bias voltage exceed 10000 V because damage to the substrate becomes large under such a voltage.

It is feasible to individually introduce the gas components of the dry etching agent into a chamber, or feasible to mix the gas components of the dry etching agent in advance and introduce the resulting mixed gas into a chamber. The total amount of the dry etching agent introduced into the reaction chamber is set as appropriate according to the capacity of the reaction chamber and the gas discharge performance of gas discharge equipment in consideration of the aforementioned concentration conditions and the undermentioned pressure conditions.

In order to obtain a stable plasma and to increase ion straightness and thereby suppress side etching, the pressure during the etching step is preferably 10 Pa or lower, more preferably 5 Pa or lower, still more preferably 1 Pa or lower. When the pressure inside the chamber is too low, the amount of ionized ions becomes small so that a sufficient plasma density cannot be obtained. Thus, the pressure during the etching step is preferably 0.05 Pa or higher.

The temperature of the substrate during the etching step is preferably 50° C. or lower. For anisotropic etching, the temperature of the substrate during the etching step is more preferably 20° C. or lower. Under high temperature conditions exceeding 50° C., the tendency of isotropic etching increases with decrease in the amount of formation of the polymerization film on the lateral walls of the trenches or etching holes so that a desired processing accuracy cannot be obtained. Further, the mask of resist material etc. may be significantly etched under those high temperature conditions.

In view of the efficiency of the device manufacturing process, the etching time is preferably 60 minutes or shorter. Herein, the "etching time" refers to the time in which the plasma of the dry etching agent is formed in the chamber and reacted with the sample.

The etching method using the dry etching agent according to the present embodiment can be carried out by various etching techniques, such as capacitively coupled plasma (CCP) etching, reactive ion etching (RIE), inductively coupled plasma (ICP) etching, electron cyclotron resonance (ECR) plasma etching and microwave etching, with no particular limitations.

In the case of etching a laminated film of different kinds of film layers, the composition ratio of the iodinated fluorocarbon compound or brominated fluorocarbon compound, the unsaturated fluorocarbon and the unsaturated hydrofluorocarbon in the dry etching agent may be changed stepwisely or periodically during the etching step.

The etching method according to the present embodiment is applicable to an etching process for formation of a trench or hole structure with a high aspect ratio.

[Manufacturing Method of Semiconductor Device]

The dry etching method according to the present embodiment is adoptable as an etching method for forming a predetermined pattern on a silicon compound film of a conventional semiconductor device. When the silicon compound film on the substrate is etched by the dry etching method according to the present embodiment, the semiconductor device having good characteristics can be manufactured with less iodine or bromine atoms remaining on the substrate.

In the case of manufacturing a semiconductor device through the adoption of the etching method according to the present embodiment, it is feasible to, after forming the silicon compound film into a desired shape by the etching step, preform a removing step of removing the polymerization film deposited on the substrate and/or the mask by ashing with a plasma generated from an oxygen-containing processing gas or by thermal annealing under an air atmosphere while heating at 100° C. to 500° C.

EXAMPLES

The present disclosure will be described in more detail below by way of the following examples. It is to be understood that the present invention is not limited to the following examples.

Example 1

(Etching Step)

FIG. 1 is a schematic view of a reaction device 10 in each of Examples and Comparative Examples. A lower electrode 14 having the function of holding a sample 18 and capable of serving as a stage, an upper electrode 15 and a pressure gauge 12 were disposed in a chamber 11 of the reaction device. A gas introduction port 16 was connected to an upper portion of the chamber 11. The chamber 11 was configured to adjust the internal pressure thereof and to excite the dry etching agent into a plasma by means of a high-frequency power source 13 of 13.56 MHz. The excited dry etching agent was brought into contact with the sample 18 placed on the lower electrode 14 whereby the sample 18 was subjected to etching. When a high-frequency power was applied by the high-frequency power source 13 in a state that the dry etching agent was introduced into the chamber, there was developed a direct-current voltage called a self-bias voltage between the upper electrode 15 and the lower electrode 14 due to a transfer speed difference between ions and electrons in the plasma. The gas inside the chamber 11 was discharged through a gas discharge line 17.

In Example 1, the samples 18 for etching test used were a wafer A having a $SiO_2$ film of 200 nm thickness formed on a Si wafer body, with a ArF photoresist film of 100 nm thickness with a hole pattern of 100 nm diameter being applied onto the $SiO_2$ film, and a wafer B having a $Si_3N_4$ film of 200 nm thickness formed on a Si wafer body, with a ArF photoresist film of 100 nm thickness with a hole pattern of 100 nm diameter being applied onto the $Si_3N_4$ film. The sample 18 for contamination measurement test used was a wafer C having only a $SiO_2$ film of 200 nm thickness formed on a Si wafer body.

The etching agent was provided by mixing $CF_3I$, $C_3F_6$ (hexafluoropropene), $C_3H_2F_4$ (trans-1,3,3,3-tetrafluoropropene), $O_2$ and Ar in amounts of 5 vol %, 10 vol %, 5 vol %, 15 vol % and 65 vol %, respectively, based on the total flow amount of the etching agent. The etching was performed by feeding the etching agent at a total flow rate of 100 sccm and plasmatizing the etching agent with the application of a high-frequency power of 400 W. Herein, the absolute value of the negative direct-current self-bias voltage developed was 550 V; and the absolute value of the pressure inside the chamber during the etching was 1 Pa.

(Etching Shape Evaluation)

Each of the wafers A and B for etching shape evaluation was placed on the stage and etched under the above-mentioned conditions. After that, the etching shapes of the respective wafers were evaluated by taking and observing cross-sectional SEM photographs of the respective wafers. As a result, it was found that the etching was performed without causing an etching shape anomaly such as shoulder loss, bowing, mask deformation or hole clogging.

(Measurement of Iodine or Bromine on Wafer)

The wafer C was tested for the amount of metal adhered to the $SiO_2$ film-coated silicon wafer C. The etching conditions were the same as those in the etching shape evaluation test. After the etching, the wafer was subjected to ashing with an oxygen plasma. The measurement of the metal amount was carried out by a method specified in JIS K0160:2009. More specifically, a plastic beaker in which hydrofluoric acid was put was placed in a container of PFA (perfluoroalkoxy fluororesin) called a VPD (vapor phase decomposition) container. The wafer C after the etching was set on a wafer stand inside the PVD container. Then, the VPD container was closed. In this state, the $SiO_2$ film on the wafer substrate was subjected to decomposition with a vapor of the hydrofluoric acid for 10 minutes. Subsequently, 100 μL of a scan liquid (ultrapure water) was dropped onto a surface of the wafer after the decomposition of the SiO$_2$ film. The whole surface of the wafer was then scanned. After the scanning, the scanned liquid was entirely dried. The resulting residue was again dissolved in ultrapure water. The thus-obtained solution was analyzed by an ICP-MS (inductively coupled plasma-mass spectrometry). The analysis value was converted to the number of metal atoms per 1 cm$^2$ of the wafer on the basis of the amount of the solution and the surface area of the wafer. As a result, the analysis result of the remaining iodine atoms was found to be 1.2×10$^{10}$ atms/cm$^2$; and the analysis result of the remaining bromine atoms was found to be 1.0×10$^{10}$ atms/cm$^2$.

Examples 2 to 9

The etching was performed under the same conditions as in Example 1, except that the mixing ratio of CF$_3$I, C$_3$F$_6$, C$_3$H$_2$F$_4$ and Ar was changed to different values.

Examples 10 and 11

The etching was performed under the same conditions as in Example 1, except that C$_2$F$_5$I or CF$_2$Br$_2$ was used in place of CF$_3$I.

Examples 12 and 13

The etching was performed under the same conditions as in Example 1, except that C$_4$F$_6$ (hexafluoro-1,3-butadiene) or C$_5$F$_8$ (octafluoro cyclopentadiene) was used in place of C$_3$H$_6$.

Example 14

The etching was performed under the same conditions as in Example 1, except that, in place of C$_3$H$_2$F$_4$ (trans-1,3,3,3-tetrafluoropropene), 2,3,3,3-tetrafluoropropene which is a structural isomer of C$_3$H$_2$F$_4$ was used.

Comparative Example 1

The etching was performed under the same conditions as in Example 1, except that C$_3$F$_6$ and C$_3$H$_2$F$_4$ were not used.

Comparative Example 2

The etching was performed under the same conditions as in Example 1, except that C$_3$F$_8$ (perfluoropropane) was used in place of C$_3$F$_6$.

Comparative Examples 3 and 4

The etching was performed under the same conditions as in Example 1, except that C$_3$H$_2$F$_6$ (1,1,1,2,3,3-hexafluoropropane) or C$_3$H$_2$F$_4$O (hexafluoropropylene oxide) was used in place of C$_3$H$_2$F$_4$ (trans-1,3,3,3-tetrafluoropropene).

The results of the respective Examples and Comparative Examples are shown in TABLE 1. In the table, the amount of the remaining iodine or bromine atoms on the silicon wafer is shown in the column of "Atom Concentration on Wafer".

TABLE 1

| | Kind of Gas | | | | | Content Rate of Gas vol % | | | | | | Atom Conc. on Substrate atoms/cm$^2$ | |
|---|---|---|---|---|---|---|---|---|---|---|---|---|---|
| | First Gas | Second Gas | Third Gas | Oxidizing Gas | Inert Gas | First Gas | Second Gas | Third Gas | Oxidizing Gas | Inert Gas | Etching Shape | Iodine | Bromine |
| Example 1 | CF$_3$I | C$_3$F$_6$ | C$_3$H$_2$F$_4$ | O$_2$ | Ar | 5 | 10 | 5 | 15 | 65 | good | 1.2 × 10$^{10}$ | <1.0 × 10$^{10}$ |
| Example 2 | CF$_3$I | C$_3$F$_6$ | C$_3$H$_2$F$_4$ | O$_2$ | Ar | 10 | 10 | 5 | 15 | 60 | good | 4.3 × 10$^{10}$ | <1.0 × 10$^{10}$ |
| Example 3 | CF$_3$I | C$_3$F$_6$ | C$_3$H$_2$F$_4$ | O$_2$ | Ar | 20 | 10 | 5 | 15 | 50 | decrease in selectivity | 9.5 × 10$^{10}$ | <1.0 × 10$^{10}$ |
| Example 4 | CF$_3$I | C$_3$F$_6$ | C$_3$H$_2$F$_4$ | O$_2$ | Ar | 30 | 10 | 5 | 15 | 40 | decrease in selectivity | 1.1 × 10$^{11}$ | <1.0 × 10$^{10}$ |
| Example 5 | CF$_3$I | C$_3$F$_6$ | C$_3$H$_2$F$_4$ | O$_2$ | Ar | 5 | 5 | 10 | 15 | 65 | good | <1.0 × 10$^{10}$ | <1.0 × 10$^{10}$ |
| Example 6 | CF$_3$I | C$_3$F$_6$ | C$_3$H$_2$F$_4$ | O$_2$ | Ar | 10 | 5 | 10 | 15 | 60 | good | 1.1 × 10$^{10}$ | <1.0 × 10$^{10}$ |
| Example 7 | CF$_3$I | C$_3$F$_6$ | C$_3$H$_2$F$_4$ | O$_2$ | Ar | 15 | 5 | 10 | 15 | 55 | good | 2.8 × 10$^{10}$ | <1.0 × 10$^{10}$ |
| Example 8 | CF$_3$I | C$_3$F$_6$ | C$_3$H$_2$F$_4$ | O$_2$ | Ar | 20 | 5 | 10 | 15 | 50 | decrease in selectivity | 6.1 × 10$^{10}$ | <1.0 × 10$^{10}$ |
| Example 9 | CF$_3$I | C$_3$F$_6$ | C$_3$H$_2$F$_4$ | O$_2$ | Ar | 30 | 5 | 10 | 15 | 40 | decrease in selectivity | 8.1 × 10$^{10}$ | <1.0 × 10$^{10}$ |
| Example 10 | C$_2$F$_5$I | C$_3$F$_6$ | C$_3$H$_2$F$_4$ | O$_2$ | Ar | 5 | 5 | 10 | 15 | 65 | good | <1.0 × 10$^{10}$ | <1.0 × 10$^{10}$ |
| Example 11 | CF$_2$Br$_2$ | C$_3$F$_6$ | C$_3$H$_2$F$_4$ | O$_2$ | Ar | 5 | 5 | 10 | 15 | 65 | good | <1.0 × 10$^{10}$ | 4.1 × 10$^{10}$ |
| Example 12 | CF$_3$I | C$_4$F$_6$ | C$_3$H$_2$F$_4$ | O$_2$ | Ar | 5 | 10 | 5 | 15 | 65 | good | 2.7 × 10$^{10}$ | <1.0 × 10$^{10}$ |
| Example 13 | CF$_3$I | C$_5$F$_8$ | C$_3$H$_2$F$_4$ | O$_2$ | Ar | 5 | 10 | 5 | 15 | 65 | clogging in some of holes | 2.9 × 10$^{10}$ | <1.0 × 10$^{10}$ |
| Example 14 | CF$_3$I | C$_3$F$_6$ | C$_3$H$_2$F$_4$ (isomer) | O$_2$ | Ar | 5 | 10 | 5 | 15 | 65 | good | 1.2 × 10$^{10}$ | <1.0 × 10$^{10}$ |
| Comparative Example 1 | CF$_3$I | — | — | O$_2$ | Ar | 30 | 0 | 0 | 15 | 55 | decrease in selectivity | >5.0 × 10$^{12}$ | <1.0 × 10$^{10}$ |
| Comparative Example 2 | CF$_3$I | C$_3$F$_8$ | C$_3$H$_2$F$_4$ | O$_2$ | Ar | 5 | 10 | 5 | 15 | 65 | decrease in selectivity | 3.8 × 10$^{11}$ | <1.0 × 10$^{10}$ |
| Comparative Example 3 | CF$_3$I | C$_3$F$_6$ | C$_3$H$_2$F$_6$ | O$_2$ | Ar | 5 | 10 | 5 | 15 | 65 | decrease in selectivity | 1.4 × 10$^{11}$ | <1.0 × 10$^{10}$ |
| Comparative Example 4 | CF$_3$I | C$_3$F$_6$ | C$_3$H$_2$F$_4$O | O$_2$ | Ar | 5 | 10 | 5 | 15 | 65 | decrease in selectivity | 1.8 × 10$^{11}$ | <1.0 × 10$^{10}$ |

In each of Examples 1 to 14 in which the plasma etching was performed with the use of the dry etching agent containing the iodinated fluorocarbon compound or brominated fluorocarbon compound, the unsaturated fluorocarbon represented by $C_nF_m$, the unsaturated hydrofluorocarbon represented by $C_xH_yF_z$ and the oxidizing gas, the amount of the remaining iodine or bromine atoms on the wafer was significantly reduced as compared with the case where both of the iodinated fluorocarbon compound and the brominated fluorocarbon compound were not contained as in Comparative Example 1. There was however a tendency that the amount of the remaining iodine atoms was increased as the content rate of the iodinated fluorocarbon compound in the etching gas became higher as in Examples 3, 4, 8 and 9. Further, the etching selectivity between the photoresist as the mask material and the etching target material such as $SiO_2$ or $Si_3N_4$ was lowered in these Examples.

In Examples 1 to 3 and 5 to 14 in which the number of iodine atoms and bromine atoms contained in the first gas was less than or equal to 2 times the number of hydrogen atoms contained in the third gas, the amount of the remaining iodine or bromine atoms on the wafer was reduced to $1\times10^{11}$ atoms/cm² or less.

In particular, the amount of the remaining iodine or bromine atoms on the wafer was reduced to $5\times10^{10}$ atoms/cm² or less in Examples 1, 2, 5 to 7 and 10 to 14 in which the number of iodine atoms and bromine atoms contained in the first gas was less than or equal to 1 time the number of hydrogen atoms contained in the third gas; and the volume of $C_3F_6$ used was 0.1 to 1 time the sum of the volumes of the unsaturated hydrofluorocarbon and the unsaturated fluorocarbon.

In comparison of the effects of the unsaturated fluorocarbon and hydrofluorocarbon between Examples 4 and 9, the amount of the remaining iodine atoms on the wafer was smaller when the content rate of the unsaturated hydrofluorocarbon was higher as in Example 9. It is assumed that this result was largely due to the effect of preventing coupling of the iodine atoms to the substrate surface by the action of the hydrogen atoms.

In Examples 12 and 13, either $C_4F_6$ or $C_5F_8$ was used as the unsaturated fluorocarbon. It is known that these unsaturated fluorocarbons are higher in polymerizability than $C_3F_6$. As a result of comparison of the test results under the same conditions as those in the case of using $C_3F_6$, there were less iodine atoms remaining on the wafer. However, there was a case where clogging occurred in some of the etching holes.

In Example 14 in which 2,3,3,3-tetrafluoropropene that is an isomer of $C_3H_2F_4$ was used, the test results were as favorable as in the case of using $C_3F_6$.

In Comparative Example 2, the saturated fluorocarbon $C_3F_8$ was used in place of the unsaturated fluorocarbon. In this case, a polymerization film was less likely to be formed. Consequently, there was a tendency that: the etching selectivity between the photoresist as the mask material and the etching target material such as $SiO_2$ or $Si_3N_4$ was lowered; and the amount of the remaining iodine atoms on the wafer was increased.

In the case where the unsaturated hydrofluorocarbon was replaced with a fluorocarbon compound containing hydrogen but not having an unsaturated bond, such as $C_3H_2F_6$ as in Comparative Example 3 or $C_3H_2F_{40}$ as in Comparative Example 4, the iodine atoms were not sufficiently removed; and the etching selectivity between the photoresist as the mask material and the etching target material such as $SiO_2$ or $Si_3N_4$ was lowered. It is assumed that, even though the unsaturated hydrocarbon was acceleratedly decomposed in the plasma due to the presence of an unsaturated bond in its molecule so that hydrogen was effectively dissociated from the molecule plasma to prevent coupling of the iodine atoms to the substrate surface, the fluorocarbon compound with no unsaturated bond did not sufficiently have such an effect. Since the fluorocarbon compound with no unsaturated bond was low in polymerizability and was less likely to form a fluorocarbon polymerization film, it is further assumed that: the etching selectivity between the mask material and the etching target material was lowered; and the amount of the remaining iodine atoms became large due to the insufficient effect of removing the iodine atoms incorporated in the polymerization film along with the removal of the polymerization film.

As described above, the dry etching method according to the present disclosure enables etching of the silicon compound film on the substrate with the use of the iodinated fluorocarbon compound or brominated fluorocarbon compound while allowing less iodine or bromine atoms to remain on the substrate.

DESCRIPTION OF REFERENCE NUMERALS

10: Reaction device
11: Chamber
12: Pressure gauge
13: High-frequency power source
14: Lower electrode
15: Upper electrode
16: Gas introduction port
17: Gas discharge line
18: Sample

The invention claimed is:

1. A dry etching method for a substrate having a silicon compound film, comprising: plasmatizing a dry etching agent; and etching the silicon compound film with the plasmatized dry etching agent through a mask formed with a predetermined opening pattern on the silicon substrate film,
   wherein the dry etching agent comprises all of the following first to fourth gases:
   first gas: at least one compound selected from the group consisting of iodinated fluorocarbon compounds and brominated fluorocarbon compounds;
   second gas: an unsaturated fluorocarbon having an unsaturated bond represented by $C_nF_m$ where n is an integer of 2 to 5; and m is an integer of 2, 4, 6 or 8, excluding the combination of n:m=2:6, 2:8, 3:2, 3:8 and 5:2;
   third gas: an unsaturated hydrofluorocarbon having an unsaturated bond represented by $C_xH_yF_z$ where x is an integer of 2 to 4; and y and z are integers satisfying y+z=2, 4, 6 or 8, excluding the combination of x:y+z=2:6, 2:8, 3:2 and 3:8; and
   fourth gas: an oxidizing gas,
   wherein a number of iodine atoms and bromine atoms contained in the first gas is less than or equal to 2 times a number of hydrogen atoms contained in the third gas, and
   wherein a volume of the first gas in the dry etching agent is larger than or equal to 0.01 times a sum of volumes of the second and third gases in the dry etching agent.

2. The dry etching method according to claim 1, wherein a volume ratio of the second gas and the third gas is 1:0.05 to 20.

3. The dry etching method according to claim 1, wherein an amount of the oxidizing gas in the dry etching agent is larger than or equal to 1 vol % and smaller than or equal to 50 vol % based on a total amount of the dry etching agent.

4. The dry etching method according to claim 1,
wherein the unsaturated fluorocarbon is at least one selected from the group consisting of $C_3F_6$, $C_4F_6$ and $C_5F_8$, and
wherein the unsaturated hydrofluorocarbon is $C_3H_2F_4$.

5. The dry etching method according to claim 4,
wherein the unsaturated fluorocarbon is hexafluoropropene, and
wherein the unsaturated hydrofluorocarbon is trans-1,3,3,3-tetrafluoropropene.

6. The dry etching method according to claim 1, wherein the oxidizing gas is at least one selected from the group consisting of $O_2$, $O_3$, CO, $CO_2$, $COCl_2$, $COF_2$ and $NO_2$.

7. The dry etching method according to claim 1,
wherein the dry etching agent comprises an inert gas as a fifth gas, and
wherein the inert gas is at least one selected from the group consisting of He, Ne, Ar, Kr, Xe and $N_2$.

8. The dry etching method according to claim 1, wherein the silicon compound film is etched with the plasmatized dry etching agent under the application of a negative direct-current self-bias voltage whose absolute value is greater than or equal to 500 V.

9. The dry etching method according to claim 1, wherein, after the etching of the silicon compound film, an amount of iodine atoms or bromine atoms remaining on a surface of the substrate with which the dry etching agent has come into contact is $1 \times 10^{11}$ atom/cm$^2$ or less.

10. The dry etching method according to claim 1, wherein the substrate is a silicon wafer.

11. The dry etching method according to claim 1, wherein the substrate has a silicon film.

12. The dry etching method according to claim 1, wherein the silicon compound film is one or more films selected from the group consisting of silicon oxide films and silicon nitride films.

13. A manufacturing method of a semiconductor device, comprising an etching step of etching a silicon compound film on a substrate by the dry etching method according to claim 1.

14. The manufacturing method of the semiconductor device according to claim 13, comprising, after the etching step, a removing step of removing by ashing or thermal annealing the mask and/or a fluorocarbon polymerization film formed during the etching step.

\* \* \* \* \*